US009360519B2

(12) United States Patent  (10) Patent No.: US 9,360,519 B2
Boudreau et al.  (45) Date of Patent: Jun. 7, 2016

(54) NON-CONTACT TESTING OF PRINTED ELECTRONICS

(71) Applicant: CORNING INCORPORATED, Corning, NY (US)

(72) Inventors: Robert Addison Boudreau, Corning, NY (US); Douglas Edward Brackley, Horseheads, NY (US); Kevin Thomas Gahagan, Painted Post, NY (US); Gary Edward Merz, Rochester, NY (US); Leon Robert Zoeller, III, Hammondsport, NY (US)

(73) Assignee: CORNING INCORPORATED, Corning, NY (US)

( * ) Notice: Subject to any disclaimer, the term of this patent is extended or adjusted under 35 U.S.C. 154(b) by 527 days.

(21) Appl. No.: 13/744,841

(22) Filed: Jan. 18, 2013

(65) Prior Publication Data

US 2013/0127487 A1 May 23, 2013

Related U.S. Application Data

(63) Continuation of application No. 12/437,779, filed on May 8, 2009, now Pat. No. 8,378,702.

(51) Int. Cl.
*G01R 31/311* (2006.01)
*G01R 31/309* (2006.01)
*G01R 31/28* (2006.01)
*G01R 31/304* (2006.01)

(52) U.S. Cl.
CPC .......... *G01R 31/309* (2013.01); *G01R 31/2808* (2013.01); *G01R 31/304* (2013.01); *G01R 31/2812* (2013.01)

(58) Field of Classification Search
None
See application file for complete search history.

(56) References Cited

U.S. PATENT DOCUMENTS

| 3,956,698 A | 5/1976 | Malmberg et al. ........ 324/754.22 |
| 4,820,916 A | 4/1989 | Patriquin ................... 250/208.2 |

(Continued)

FOREIGN PATENT DOCUMENTS

| JP | 1989-207671 | 8/1989 |
| JP | 1990-262071 | 10/1990 |

(Continued)

OTHER PUBLICATIONS

Hanzhi Wei, Wenlian Li, Mingtao Li, Wenming Su, Qi. Xin, Jinghua Niu, Zhigiang Zhang, Zhizhi Hu, "White organic electroluminescent device with photovoltaic performances", Applied Surface Science vol. 252, Issue 6, Jan. 15, 2006, pp. 2204-2208.

(Continued)

*Primary Examiner* — Melissa Koval
*Assistant Examiner* — Courtney McDonnough
(74) *Attorney, Agent, or Firm* — Kevin M. Able

(57) ABSTRACT

Apparatus and methods for non-contact testing of electronic components printed on a substrate (3) are provided. Test circuits (11) are printed on the substrate (3) at the same time as the desired electronic component. The test circuits (11) are all optical and include a first portion (13) for providing electrical energy for the test circuit (11) and a second portion (15) for generating a detectable optical signal that is indicative of at least one electrical property of the electronic component. The test circuits are used in real time and minimize the production of unusable scrap in the printing of such products as ePaper.

9 Claims, 2 Drawing Sheets

(56) References Cited

U.S. PATENT DOCUMENTS

| | | | |
|---|---|---|---|
| 6,147,662 A | 11/2000 | Grabau et al. | 343/895 |
| 6,156,450 A | 12/2000 | Bailey | 429/93 |
| 6,300,785 B1 | 10/2001 | Cook | 324/754.21 |
| 6,603,302 B2 | 8/2003 | Prineppi | 324/133 |
| 6,686,760 B2 | 2/2004 | Hirt | 324/765 |
| 6,771,807 B2 | 8/2004 | Coulombe et al. | |
| 6,815,973 B1* | 11/2004 | Conn | 324/750.3 |
| 6,855,378 B1 | 2/2005 | Narang | |
| 6,859,031 B2 | 2/2005 | Pakdaman et al. | 324/233 |
| 6,946,216 B2 | 9/2005 | Mu-Tsai et al. | 429/62 |
| 7,215,133 B2 | 5/2007 | Kwark | 324/765 |
| 7,301,458 B2 | 11/2007 | Carrender et al. | 340/572.1 |
| 7,474,112 B2 | 1/2009 | Wills | 324/763 |
| 2006/0139041 A1 | 6/2006 | Nystrom et al. | 324/754 |
| 2006/0255941 A1* | 11/2006 | Carrender et al. | 340/572.1 |
| 2006/0267622 A1 | 11/2006 | Lagowski et al. | 324/765 |
| 2006/0279297 A1 | 12/2006 | Nystrom et al. | 324/754 |
| 2007/0048948 A1 | 3/2007 | Vagos | |
| 2007/0130490 A1 | 6/2007 | Silverman et al. | 714/734 |
| 2007/0234918 A1 | 10/2007 | Hirahara et al. | |
| 2008/0042558 A1 | 2/2008 | Buchhauser et al. | 313/504 |
| 2008/0084678 A1* | 4/2008 | Burhance et al. | 361/761 |
| 2008/0238433 A1 | 10/2008 | Joutsenoja et al. | 324/457 |

FOREIGN PATENT DOCUMENTS

| | | |
|---|---|---|
| JP | 2004-341216 | 12/2004 |
| JP | 2008-52168 | 3/2008 |
| JP | 2009-80262 | 4/2009 |
| KR | 20080046125 | 5/2008 |
| WO | 2008126987 | 10/2008 |

OTHER PUBLICATIONS

Machine Translation JP1989-207671.
Machine Translation JP1990-262071.
Machine Translation JP2004-341216.
Machine Translation JP2008-52168.
Machine Translation JP2009-80262.
TW099114679 Search Report.
CN2010800208917 Search Report.
JP2012-509934 Office Action.
Office Action mailed on Jun. 10, 2015 in Korean patent application No. 10-2011-7029382.

\* cited by examiner

NON-CONTACT TESTING OF PRINTED ELECTRONICS

CROSS-REFERENCE TO RELATED APPLICATIONS

This application is a continuation of and claims the benefit of priority to U.S. patent application Ser. No. 12/437,779, filed on May 8, 2009, the content of which is relied upon and incorporated herein by reference in its entirety.

FIELD

This disclosure relates to the printing of electronics on substrates, e.g., thin glass substrates, and, in particular, to non-contact testing of printed electronics on such substrates.

BACKGROUND

Electronic paper, also known as ePaper, is a new category of display that is expected to become widely used in the coming years. The display operates in a reflective mode and is bi-stable, i.e., it has two stable states. As such, the display uses low power, generally only requiring power to change the image and almost no power to maintain an image.

Because they compete with ordinary printed paper, the most common form of a display, ePaper displays must be made at low cost. Accordingly, like ordinary printed paper, ePaper needs to be made by a printing process. Specifically, the manufacturing process for producing the electronics used in ePaper displays needs to be a printing process, either on individual sheets or on a web, e.g., a roll-to-roll process. The printing speeds can be expected to be similar to those used in newspaper and magazine production except that rather than ordinary inks, electronic inks will be used to produce the electronic circuits employed in the ePaper display.

A major consequence of producing displays at high speed by printing is that a large number of displays are made in a very short time. Consequently, there needs to be a way to know if the displays are good and the process is in control. If not, a large amount of scrap will be made very quickly. It is thus critical to know the quality of the printed electronics on the press as the display is being made. The present disclosure addresses this critical need for successful adoption of ePaper displays on a widespread commercial scale.

SUMMARY

In accordance with a first aspect, a non-contact method is disclosed for testing the printing of an electronic component on a substrate (3) which includes:
(A) printing (i) an electronic component and (ii) a test circuit (11) on a substrate (3), where the test circuit (11) includes:
  (a) a first portion (13) for providing electrical energy for the test circuit (11);
  (b) a second portion (15) for generating a detectable optical signal, the signal being indicative of at least one electrical property of the electronic component; and
  (c) a circuit connecting the first (13) and second (15) portions; and
(B) providing electrical energy at the first portion (13); and
(C) detecting the second portion's (15) detectable optical signal.

In accordance with a second aspect, apparatus is disclosed for printing an electronic component which includes:
(a) a device for printing (i) an electronic component and (ii) a test circuit (11) on a substrate (3); and
(b) a light detector (25) for detecting light from an area (15) of the substrate (3), the light being indicative of at least one electrical property of the electronic component.

In accordance with a third aspect, a substrate (3) is disclosed that includes (i) a printed electronic component and (ii) a printed test circuit (11), where the test circuit (11) includes:
(a) a first portion (13) for providing electrical energy for the test circuit (11);
(b) a second portion (15) for generating a detectable optical signal, the signal being indicative of at least one electrical property of the electronic component; and
(c) a circuit connecting the first (13) and second (15) portions.

The reference numbers used in the above summaries of the various aspects of the disclosure are only for the convenience of the reader and are not intended to and should not be interpreted as limiting the scope of the invention. More generally, it is to be understood that both the foregoing general description and the following detailed description are merely exemplary of the invention and are intended to provide an overview or framework for understanding the nature and character of the invention.

Additional features and advantages of the invention are set forth in the detailed description which follows, and in part will be readily apparent to those skilled in the art from that description or recognized by practicing the invention as described herein. The accompanying drawings are included to provide a further understanding of the invention, and are incorporated in and constitute a part of this specification. It is to be understood that the various features of the invention disclosed in this specification and in the drawings can be used in any and all combinations.

DETAILED DESCRIPTION OF THE PREFERRED EMBODIMENT

Figure 1:
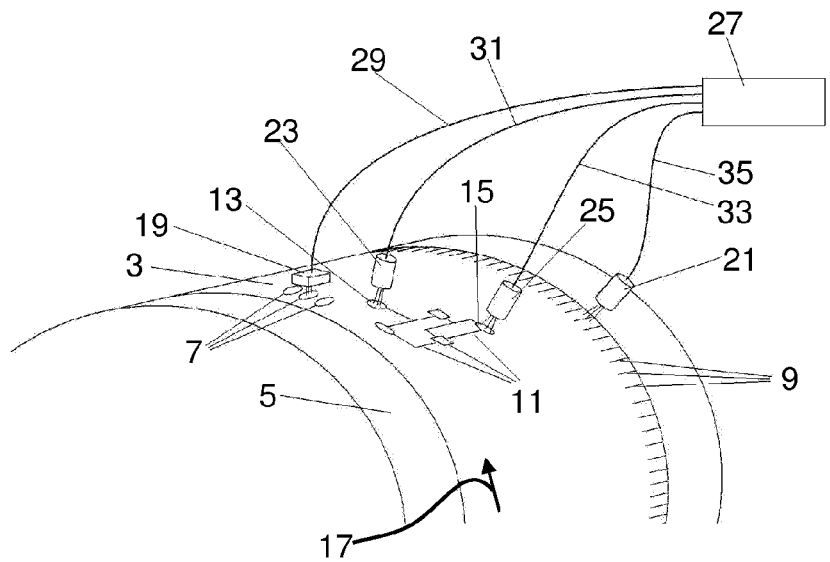
FIG. 1 is a schematic diagram illustrating a printed flexible web being conveyed over a transport roll. The web has printed registration marks, a printed registration grid line, and a printed test circuit, and the system includes registration sensors, a test circuit energy source, and a test circuit sensor for interacting with the control and test components printed on the web.

As discussed above, the present disclosure provides non-contact methods and apparatus for testing a printed electronic component. The methods and apparatus can be used to test a single component, multiple components, and/or entire circuits. The component(s) can be as simple as a conductor or as complex as, for example, an entire operating device.

For ease of presentation, the following discussion and the claims refer to the testing of an "electronic component," it being understood that this term is used generically to refer to the testing of a single electronic component, multiple components, or one or more circuits composed of components, as the case may be in any particular application of the testing methods and apparatus disclosed herein. Also, some of the following discussion is in terms of testing a printed display device, e.g., ePaper, it being understood that the methods and apparatus can be used to test a printed electronic component designed for other applications.

As described in detail below, in general terms, an all-optical system is provided for probing and measuring a test circuit that is printed on the same substrate as a desired electronic component and indeed may include all or part of the electronic component. Optical power and/or an in situ battery is used to power the test circuit and an optical emission from the test circuit and/or a change in an optical property of the circuit is detected to determine whether or not the printing process is operating properly.

The test circuit is printed at the same time as the electronic component and thus is subject to the same printing conditions. Multiple test circuits are normally used and are strategically located at a density that provides a sampling rate which provides confidence that the electronic product, e.g., ePaper, has been properly printed. The test circuits are located in benign sections of the substrate where they will not interfere with the operation of the electronic component and the overall functioning of the product.

Because the methods and apparatus involve no physical contact with the display, they have the important advantage that there is no possibility of causing mechanical damage to the electronic component. Compared to the use of radio frequency (RF) testing, optical testing has the advantage that the spatial extent of the test area can be much smaller. Test circuits based on radio waves require relatively large antennae structures to respond to the long wavelengths of the radio wave energy and the resulting larger test areas reduce the amount of area remaining for use as the ultimate product. Compared to contact methods, the non-contact testing methods disclosed herein avoid problems with contamination, as may happen with fluid droplets, and wearing of the surfaces of the printed electronic product, as may happen with mechanical probes.

The substrate on which the display is printed can be in the form of a continuous web or individual sheets. In terms of composition, it can be composed of glass, plastic, glass-plastic laminates, or other materials suitable for supporting an electronic component. Preferably, the substrate has a flexibility comparable to that of conventional printed matter. In the case of a web, the printing can employ a roll-to-roll printing press, such as those used to print newspapers or magazines in a high speed gravure, flexographic, rotary screen, or offset process. Similarly, in the case of substrates that are individual sheets, the sheets can be printed using high-volume techniques of the type previously used in the printing industry. In either case, real-time, high-speed testing is critical to avoid or reduce the production of costly scrap. Commercial scale printing, either of webs or sheets, can produce large quantities of product at low cost with minimal labor. However, such processes always run the risk of producing large quantities of scrap in a matter of moments if testing is not done in real time while the product is being produced.

FIG. 1 shows a representative set of components for testing electronic printing in a web-based system. Sheet-based embodiments will use similar components deployed to test electronic components on individual printed sheets, rather than a continuous web. As shown in FIG. 1, a printed web 3 is carried on a transport roll 5 (also known as a conveyance roller). As indicated by arrow 17, roll 5 and thus web 3 rotates counterclockwise in this figure.

Printed on web 3 are various testing and control components in addition to the circuits that will be used to display an image to a user, which, for purposes of clarity, are not shown in FIG. 1. Among the testing and control components are registration marks 7, registration grid line 9, and test circuit 11, which includes a first portion 13 which provides electrical energy for the test circuit and a second portion 15 which generates a detectable optical signal which is indicative of at least one electrical property of the test circuit and thus of the electronic component printed on the web in the vicinity of the test circuit. First portion 13 can, for example, be a printed optical sensor, such as a photodiode, while second portion 15 can, for example, be a printed energy emitter, such as a LED.

Arranged around roll 5 are various components used to interact with the testing and control components printed on web 3. Thus, registration sensor 19 is aligned with registration marks 7 and registration sensor 21 is aligned with registration grid line 9. To power test circuit 11, an external energy source 23 (e.g., a LED) is aligned with first portion 13, and to read testing information generated by the test circuit, an external sensor 25 (e.g., a photodiode) is aligned with second portion 15. As discussed below, in certain embodiments, the test circuit internally generates its own power so that an external energy source is not used. Also, rather than emitting optical energy at second portion 15, the test circuit can produce a change in an optical property (e.g., color) of that portion. In such a case second portion 15 will not normally generate optical energy and thus, in addition to an external sensor, it may be desirable to align a light source with second portion 15 to facilitate detection of the optical property, e.g., to produce reflected light which is detected by external sensor 25.

In addition to the foregoing components, FIG. 1 also illustrates the use of a computer and signal processor 27 which is connected to registration sensor 19, external energy source 23, external sensor 25, and registration sensor 21 by leads 29 through 35, respectively. The computer and signal processor controls the operation of these components and receives and analyzes data indicative of the status of the electronic printing process.

In general terms, as illustrated in FIG. 1, the test circuit includes a first area (e.g., a photovoltaic segment) which generates power to run the test circuit using light from an external light source and a second area (readout segment) at which the test circuit generates a detectable optical signal that is read by a detector. While various printable organic photovoltaic systems have been demonstrated and can be used in connection with this disclosure, in certain embodiments, it may be desirable to use a common materials set and device structure to generate both a photovoltaic power source and an emissive optical signal.

For example, devices containing combined charge transport/emissive layers such as m-MTDATA and TBADN have been shown to emit light under a bias voltage as an organic light emitting diode (OLED), but also exhibit a photovoltaic response to UV light as an organic photovoltaic (OPV). See Hanzhi Wei, Wenlian Li, Mingtao Li, Wenming Su, Qi. Xin, Jinghua Niu, Zhiqiang Zhang, Zhizhi Hu, White organic electroluminescent device with photovoltaic performances, Applied Surface Science Volume 252, Issue 6, 15 Jan. 2006, Pages 2204-2208. Other systems having similar properties have been described in the literature. Using these types of systems, an electronic component, e.g., an ePaper display, and one or more test circuits for the component can be constructed without introducing costly additional process steps or additional material layers.

As noted above, rather than using an emissive readout, in certain embodiments, the readout can be a change in an optical property of an area of the test circuit. For example, the readout can be based on the color of an electrochromic display. As with emissive readouts, it is possible to minimize the need for additional process steps or additional material layers for readouts based on a change in an optical property of the test circuit. For example, a common device structure has been employed in dye-sensitized solar cell devices and electrochromic display devices, where the principle difference between the devices has been the choice of dyes for photovoltaic absorption or electrochromic behavior. Using this common structure along with a single additional printing step, i.e., an additional printing step for the photovoltaic dye, allows the creation of a printed substrate having a photovoltaic cell that may be used both for manufacturing diagnostics and for powering the final device.

To operate the test circuit of FIG. 1, energy is injected into the circuit at one point along the web and the response of the circuit to this inputted energy is detected at a second point on the web. Depending on the structure of the test circuit, a variety of tests can be performed, including but not limited to: (1) a calibration test to insure that the test circuit is working; (2) a continuity test to insure that electrodes are not open circuited or shorted; (3) a line resistance test to measure the effective conductive ability of the electrodes; and/or (4) a capacitance test to measure the effectiveness of dielectrics in the circuit.

In particular, a calibration test can be performed to ensure that powering and reading of measurements for the test circuit are satisfactory, independent of the electronic component to be tested. Because it is normally desirable for the test circuit to occupy only a small fraction of the surface of the substrate, the receiving and sending functions generally need to be adjacent to each other with a minimal practical spacing between them.

Thus, in embodiments using an external light source and an emissive readout, light will be sent to a printed receiver area on the substrate (first portion) with the readout area (second portion) being printed close nearby. When activated, the receiving area will generate the power necessary to operate the readout area. If the readout area is an OLED device then the testing can normally be completed quite quickly. If the readout area is electrochromic then the output may not be fully developed, but there may be the beginnings of a color change that can be detected.

The location and size of the powering and reading heads will, in general, be different depending on the type of readout system being used. For an OLED system, the reading and powering can be done at the same instant in time. For an electrochromic system, it may be necessary to apply input power longer, requiring illuminating a photodetector section on the substrate over a span of time and then polling for data at the readout area further down the web to allow time for the electrochromic material to change color. In either case, if the OLED device illuminates or the electrochromic device becomes colored, then the calibration was successful.

A continuity test is used to ensure that there are no open circuits on a typical printed line. For this test, the photodetector powering section and the OLED readout or electrochromic readout can be the same as described above with regard to calibration except that they will now be separated by a span of conductor. If there is an open circuit in the conductor then the readout fails. If the response is the same or essentially the same as that produced during calibration, then conductor continuity is acceptable. Test circuits for testing continuity can be placed in different directions and can test different lines. The tested line can be part of the electronic component, but normally will be a test line representing the electronic component rather than an actual part of the electronic component.

A line resistance test is most often done to be sure that transparent conductors are not too resistive. In this case, the test circuit includes a capacitor printed in series with a continuity line. The circuit is powered up with the photodetector section and the amount of time it then takes to power up the OLED or electrochromic device provides a measure of the amount of resistance in the line. This test is most effective with an OLED readout because of the OLED's fast response time which allows activation and deactivation of the system to be used as an estimate of the resistance in series with the capacitor.

A capacitance test can be performed by determining the time it takes to charge and/or discharge a printed capacitor on the substrate. This test is performed as in the continuity test above, except that there is added a printed capacitor. To determine the capacitance, conductors of two different lengths can be connected to the capacitor. The frequency of the blinking (charging and discharging) of the OLED (or, more precisely, one over the blinking frequency) provides an estimate of the product of the test circuit's resistance and capacitance. Determining the blinking frequency for two different line lengths allows one to obtain a value for the capacitance. The two line lengths can be activated separately by, for example, printing two photodetectors on the substrate, one for powering one of the lines and the other for powering the other line.

Once the capacitance is known, it is possible to determine a value for the dielectric constant K of the dielectric material of the capacitor using the equation $K=Cd/A$ where C is capacitance, d is the thickness of the dielectric, and A is the area of one of the capacitor's plates. The thickness of the dielectric can be determined using, for example, an X-ray fluorescence sensor or by an optical thickness measurement assuming the material's refractive index is known. Both thickness measurements can be performed without contacting the substrate using commercially available equipment. Measurements of capacitance can also provide information regarding dielectric integrity, i.e., the measurements can reveal if there are defects in the dielectric such as shorts or other sources of loss.

In FIG. 1, an external LED is used to supply the activating energy to the printed circuit and an internal printed LED, e.g., an OLED, is used to emit energy back to an external photodiode connected to computer 27. Instead of a LED, the external energy source can be a semiconductor laser. However, LEDs will often be more suitable since they are generally more robust and less expensive than semiconductor lasers. As a further alternative, the external energy source can be replaced with a low energy light source and an on-board battery which transforms chemical energy into electrical energy can be printed on the substrate and used to power the test circuit when activated by light from the low energy source. Alternatively, the battery can be constructed so as to be self-starting either after a delay or immediately after it is printed on the substrate. With regard to the external sensing device, this component of the system can be a photodiode as shown in FIG. 1, a line-scan CCD camera (see below), or another electronic component capable of detecting optical energy.

Because the non-contact testing needs to be performed at printing speeds and because, in general, substantial data is needed for each measurement, the detector portion of the system needs a fairly fast response time. Also, cost is always an issue and thus in certain embodiments, the detector and signal processor employ commercially-available, rather than custom, equipment.

The type of detector (sensor) that can be used to read the light response from the test circuit depends on the circuit's RC characteristics. The energy inputted to the test circuit can have a variety of temporal wave forms, examples of which include an impulse function, a series of timed on/off pulses (a pulse train), and a sine wave. As a further alternative, the quality of a circuit can be determined by inputting a pulse train that is at the printed circuit's natural resonance frequency and detecting the amplitude of the resonance output. The external sensor and associated circuitry could, in this case, simply output a 0 for a low amplitude response and a 1 for an acceptable response.

The external sensing circuit measures the response of the circuit to inputs of the foregoing types. In particular, to provide an effective measure of the printed circuit's capabilities, the external sensor must respond to the AC component of the test circuit's output emitter. Some printed circuits can have natural resonances in the kilohertz range and others in the megahertz range. To characteristic effectively such response frequencies using an A/D converter, the signal should be quantized at a rate of over two times the signal frequency.

For example, if a circuit has a natural frequency of 1 KHz, a digitization rate of around 4 KHz would be suitable to depict accurately the circuit's capability. A photo sensor attached to an A/D converter can easily provide data at this rate with inexpensive electronics. If a scanning device such as a line-scan CCD or a contact sensor with a thousand elements is used, the device would need to scanned at 4000 times a second which would produce a total digitization rate of 4 MHz. Although this is readily achievable with available equipment, it would be more expensive. Such line-scanning, however, can be advantageous when the density of the test circuits is high.

If the frequency response of the test circuit is around 1 MHz, instead of 1 KHz, and a single sensor connected to an A/D converter is used, the data can again be processed with commercially-available equipment. However, for a thousand element CCD or contact sensor, the digitization rate rises to 4 GHz and although this can be done, it would require expensive equipment. To avoid such costs, a sensor with 10 to 50 elements could be used so as to reduce the data rate to 10 to 50 MHz. Such data rates are easily managed with currently available imaging systems.

Because the test circuit's energy emitter is on a moving web, there is a short window in time in which the emitter can communicate with the external sensor and the length of this window is inversely proportional to the speed of the moving web. This temporal communication window dictates another limit on the circuit's RC timing measurements.

Consider the case where the emitter is in communication with the external sensor for a distance of 1 mm and the web is moving at 75 mm/sec (3 in/sec). The communication window under these conditions is 13 milliseconds. If the circuit under test is excited with an input pulse train of one millisecond on and one millisecond off and this happened to be the optimum frequency for circuit measurement, the temporal measurement window would only allow measurement of the response to about 6 pulses. If, however, the circuit under test was excited with an input pulse train at a rate of 0.5 MHz and again, this happened to be the optimum frequency for the circuit test, the communication window would allow measurement of the response from 6000 pulses. One can therefore conclude that there is a lower frequency limit to the measurement that can be made.

This is not a problem for slow moving webs since the RC time constant is relatively low and the natural resonant frequency of the test circuit would be well above the KHz rate. However, as web speed increases, the temporal communication window decreases and thus the test circuit needs to be designed with this limitation in mind.

Figure 2:
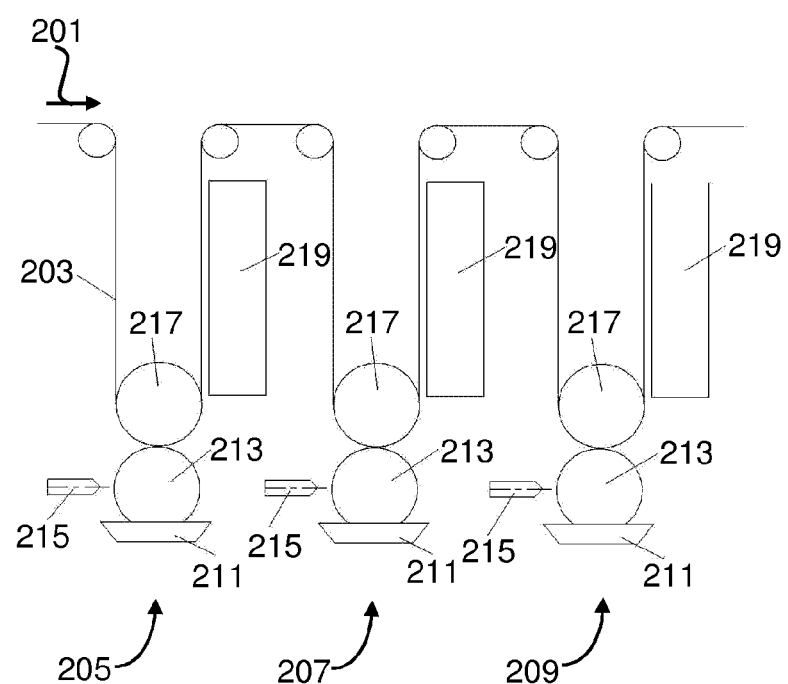
FIG. 2 is a schematic diagram of a multiple station printing process in which the testing methods and apparatus disclosed herein can be employed.

FIG. 2 shows a typical multiple station printing process in which the testing methods and apparatus disclosed herein can be employed. In this figure, arrow 201 indicates the direction of conveyance of web 203 which is being printed and reference numbers 205, 207, and 209 represent first, second, and third printing stations, respectively, each of which includes an electronic ink pan 211, a print cylinder 213, a doctor blade 215, an impression roll 217, and a dryer 219.

The apparatus of FIG. 2 can be operated in various manners, including, for example, as follows. At the first (master) printing station 205, a discrete registration mark (e.g., reference number 7 in FIG. 1) is printed on the edge of the web, once per rotation of print cylinder 213. This mark acts as a scale that can be used to precisely detect the first print pattern on the web. Registration sensors (not shown) at the subsequent print stations can detect this mark and provide information to a press control system about the position of the first print pattern. The press control system can use this information to adjust the rotational phase angles of the subsequent print cylinders relative to the first (master) print cylinder. In this way, each subsequent printed layer can be precisely registered to the first (master) printed layer. A registration mark can also be printed for each of the subsequent layers (again, see, for example, reference number 7 in FIG. 1). These additional marks can be used to adjust subsequent print layers to each other, if, for example, layer-to-layer registration is more critical than registration to the first (master) layer.

In addition to the discrete registration mark(s), a continuous registration grid pattern (e.g., reference number 9 in FIG. 1) can also be printed on the web at the first (master) print station. This grid pattern can, for example, be utilized at the test locations to detect the start of each printed test circuit. A registration sensor (e.g., reference number 21 in FIG. 1) can provide a signal to a computer and signal processor (e.g., reference number 27 in FIG. 1) to energize an external energy source (e.g., reference number 23 in FIG. 1) when the printed sensor (e.g., reference number 13 in FIG. 1) is passing beneath it, thus providing power to the test circuit (e.g., reference number 11 in FIG. 1). The continuous registration grid can also provide a second signal to the computer and signal processor to tell it when to look for an output signal from the printed energy emitter (e.g., reference number 15 in FIG. 1) using an external sensor (e.g., reference number 25 in FIG. 1). Furthermore, this grid pattern can be used to tag the location of each test pattern so that the data collected and analyzed by the computer can be associated with the position of the test circuit along the web. Thus a map of "good" and "bad" results can be generated, allowing the printed electronics associated with the "bad" results to be subsequently discarded.

Figure 3:
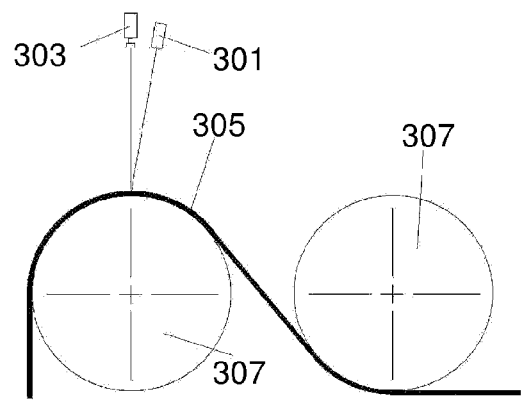
FIG. 3 is a schematic diagram illustrating scanning of a web with a CCD camera.

In addition to the electronic testing illustrated in FIG. 1, the printed electronic circuits can also be tested for geometric printing flaws. For example, the electronic component can be optically scanned at the appropriate resolution and a series of image analysis rules applied to the scanned image to see if landmark features of the component are printed within a specified tolerance and contain no opens and no shorts. FIG. 3 illustrates a system for performing such an inspection using an illumination source 301 and one or more cameras 303

(e.g., one or more CCD cameras) focused on a portion of web 305 as the web traverses transport roll 307. The camera must be focused on the surface of the web by a lens whose working distance will typically be in the range of from 6 inches to two or three feet in order to collect data from a 6" to 12" field-of-view. For some applications, such working distances could be difficult to accommodate near a transport (or printing) roll.

Figure 4:
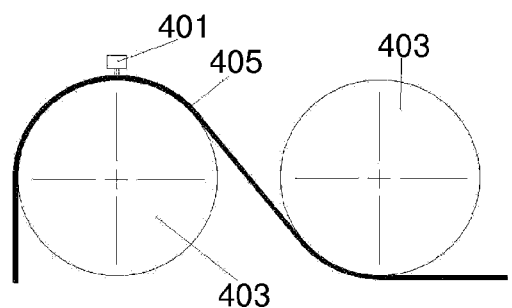
FIG. 4 is a schematic diagram illustrating scanning of a web with a contact sensor.

FIG. 4 shows a system which addresses the issue of limited available space around a transport (or printing) roll. This system uses a contact optical sensor 401, which, as shown, is positioned over transport roll 403 adjacent to web 405. (Although as commercially produced, this sensor is referred to as a "contact" sensor, as employed herein, the sensor does not actually make contact with the transport (or printing) roll.) Contact sensors are widely used in desk top scanners and FAX machines and thus are readily available at low cost. Also, they have small footprints allowing them to be placed directly over a roll without consuming a large amount of space.

Contact sensor 401 can be composed of (i) a line of sensors and (ii) a line of small gradient index lenses (GIL) which focus the surface of the web onto the line of sensors. The contact sensor can also contain a light source, e.g., a row of LEDs, to illuminate the surface of the web. In terms of size, the contact sensor can have a cross-section of less than 1 inch by 1 inch and can be placed approximately 0.05" from the surface of the web. Commercially-available devices have scan widths of 4 inches to 10 inches and custom devices can cover up to 20 inches. Commercial contact sensors have resolutions between 200 pixels per inch to 2400 pixels per inch.

Figure 5:
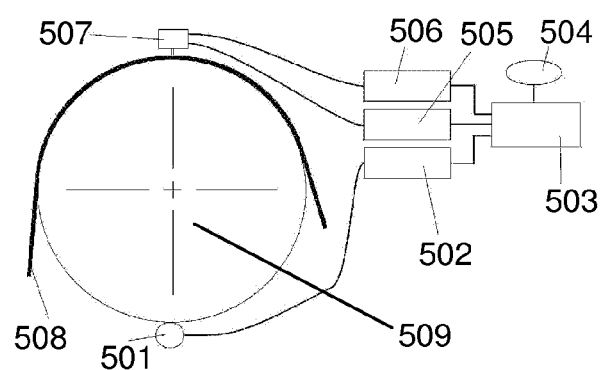
FIG. 5 is a schematic, block diagram illustrating a sensor system employing a contact sensor.

FIG. 5 shows a block diagram of an integrated system for performing (i) image analysis for detecting geometric printing flaws and (ii) test circuit analysis for detecting electrical flaws. Using encoder 501, encoder interface 502, and computer 503, the system first determines web speed and printed circuit position. Using this information, sensor controller 505, and illumination controller 506, the scan rate of contact sensor 507 is controlled, as is the illumination provided by the contact sensor so as to maintain a constant exposure of web 508 on transport roll 509. The image of the web produced in this way is processed and interpreted by computer 503, with the results being stored in storage medium 504.

To perform an electrical test, the computer activates the contact sensor's illuminators as the printed sensors on web 508 passed under the illuminators. The emitted output from the web is then read at the contact sensor's photodiodes and the resulting data sent to computer 503 for analysis. It should be noted that in this and other embodiments, a great increase in signal to noise ratio can be achieved by using different wavelengths for the external excitation source, e.g., the LEDs of a contact sensor, and the energy emitter of the printed test circuit. In particular, this increase in the S/N ratio can be achieved by placing a filter in front of the external sensor which transmits light having the wavelength generated by the test circuit's energy emitter and blocks light generated by the external excitation source.

Table 1 summarizes the various detection approaches that can be used to test printed circuits both from a physical integrity and an electrical point of view. The table is in terms of testing an ePaper display, it being understood that the tests described therein can be performed on electrical circuits printed on webs and sheets used for other purposes. Similarly, the sensors, energy sources, and emitters listed in Table 1 represent exemplary, non-limiting embodiments.

More generally, a variety of modifications that do not depart from the scope and spirit of the invention will be evident to persons of ordinary skill in the art from the foregoing disclosure. The following claims are intended to cover the specific embodiments set forth herein as well as modifications, variations, and equivalents of those embodiments.

TABLE 1

| Detection Type or Definition | External* Input Energy Source | Internal Sensor | Internal Input Energy Source | Internal Emitter Type | External Sensor Type |
|---|---|---|---|---|---|
| Scan the ePaper Surface | LED, Laser | | | | Linear CCD |
| Scan the ePaper Surface | LED, Laser | | | | contact sensor |
| Sense Circuit Functionality | LED, Laser | Photo Diode | | LED, OLED | Linear CCD |
| Sense Circuit Functionality | LED, Laser | Photo Diode | | LED, OLED | contact sensor |
| Sense Circuit Functionality | | | battery | LED, OLED | Linear CCD |
| Sense Circuit Functionality | | | battery | LED, OLED | contact sensor |

*Note:
The word "external" refers to any device which is external to the ePaper.
The word "internal" refers to any device which can be printed on the ePaper.

What is claimed is:

1. An all-optical test system for testing a printed electronic component on a substrate, the test system comprising:
    (i) the printed electronic component; and
    (ii) a printed test circuit, where the test circuit comprises:
        (a) a first portion that generates electrical energy that powers the test circuit, wherein the electrical energy is generated from an external LED, an external semiconductor laser, or an external low energy light source in combination with a battery mounted on the test circuit;
        (b) a second portion for generating a detectable optical signal, said signal being indicative of at least one electrical property of the electronic component, the at least one electrical property indicating proper operation of a printing process for the printed electronic component; and
        (c) a circuit connecting the first and second portions.

2. The substrate of claim 1 wherein the substrate is in roll form.

3. The substrate of claim 1 wherein the test circuit emits optical energy at the second portion.

4. The substrate of claim 1 wherein the test circuit is configured to produce a change in an optical absorption property at the second portion.

5. The substrate of claim 1 wherein the test circuit transforms optical energy into electrical energy at the first portion.

6. The substrate of claim 1 wherein the test circuit transforms chemical energy into electrical energy at the first portion.

7. The substrate of claim 1 wherein the test circuit comprises a common material which (i) transforms optical energy into electrical energy at the first portion and produces optical energy at the second portion or (ii) transforms chemical energy into electrical energy at the first portion and produces a change in an optical absorption property at the second portion.

8. The substrate of claim 1 wherein the test circuit is selected from the group consisting of a longitudinal conductor, a transverse conductor, a transistor-containing circuit, a capacitor, a resistor, an inductor, and combinations thereof.

9. The substrate of claim 1 wherein the test circuit includes at least a portion of the electronic component.

* * * * *